US008003883B2

(12) United States Patent
Korevaar et al.

(10) Patent No.: US 8,003,883 B2
(45) Date of Patent: Aug. 23, 2011

(54) NANOWALL SOLAR CELLS AND OPTOELECTRONIC DEVICES

(75) Inventors: Bastiaan Arie Korevaar, Schenectady, NY (US); Loucas Tsakalakos, Niskayuna, NY (US); Joleyn Balch, Schaghticoke, NY (US)

(73) Assignee: General Electric Company, Niskayuna, NY (US)

( * ) Notice: Subject to any disclaimer, the term of this patent is extended or adjusted under 35 U.S.C. 154(b) by 741 days.

(21) Appl. No.: 11/622,295

(22) Filed: Jan. 11, 2007

(65) Prior Publication Data

US 2008/0169019 A1    Jul. 17, 2008

(51) Int. Cl.
*H01L 31/00* (2006.01)

(52) U.S. Cl. ........ 136/255; 136/258; 136/261; 257/431; 257/461; 257/465; 977/712; 977/720; 977/762; 977/948; 977/954

(58) Field of Classification Search .................. 136/243, 136/285, 260, 263, 264, 255, 258, 261; 257/292, 257/293, 431, 461, 465; 977/712, 720, 762, 977/948, 954
See application file for complete search history.

(56) References Cited

U.S. PATENT DOCUMENTS

| 4,079,124 | A | | 3/1978 | Winchell |
|---|---|---|---|---|
| 4,332,974 | A | * | 6/1982 | Fraas ........................... 136/249 |
| 4,385,430 | A | * | 5/1983 | Bartels ........................... 29/458 |
| 5,580,492 | A | | 12/1996 | Bonnemann et al. |
| 5,665,331 | A | | 9/1997 | Bagchi et al. |
| 5,851,508 | A | | 12/1998 | Greff et al. |
| 5,928,626 | A | | 7/1999 | Klaveness et al. |
| 6,198,091 | B1 | * | 3/2001 | Forrest et al. .............. 250/214.1 |
| 6,203,778 | B1 | | 3/2001 | Brasch |
| 6,417,244 | B1 | | 7/2002 | Wellinghoff et al. |
| 6,660,248 | B2 | | 12/2003 | Wilson et al. |
| 6,743,936 | B1 | | 6/2004 | Wellinghoff et al. |
| 6,955,639 | B2 | | 10/2005 | Hainfeld et al. |
| 2004/0109666 | A1 | * | 6/2004 | Kim, II ........................ 385/147 |

(Continued)

FOREIGN PATENT DOCUMENTS

WO     WO 03/075961 A1     9/2003

(Continued)

OTHER PUBLICATIONS

Lim et al., A novel structure, high conversion efficiency p-SiC/graded p-SiC/i-Si/n-Si/metal substrate-type amorphous silicon solar cell, J. Appl. Phys. 56(2), Jul. 15, 1994, p. 538-542.*

(Continued)

*Primary Examiner* — Basia Ridley
*Assistant Examiner* — Devina Pillay
(74) *Attorney, Agent, or Firm* — Paul J. DiConza

(57) ABSTRACT

A photovoltaic device that includes a substrate and a nanowall structure disposed on the substrate surface. The device also includes at least one layer conformally deposited over the nanowall structure. The conformal layer(s) is at least a portion of a photoactive junction. A method for making a photovoltaic device includes generating a nanowall structure on a substrate surface and conformally depositing at least one layer over the nanowall structure thereby forming at least one photoactive junction. A solar panel includes at least one photovoltaic device based on a nanowall structure. The solar panel isolates such devices from its surrounding atmospheric environment and permits the generation of electrical power. Optoelectronic device may also incorporate a photovoltaic device based on a nanowall structure.

21 Claims, 12 Drawing Sheets

U.S. PATENT DOCUMENTS

| | | | |
|---|---|---|---|
| 2004/0118448 A1* | 6/2004 | Scher et al. | 136/252 |
| 2005/0072456 A1* | 4/2005 | Stevenson et al. | 136/244 |
| 2005/0121068 A1* | 6/2005 | Sager et al. | 136/252 |
| 2006/0084278 A1 | 4/2006 | Winter et al. | |
| 2007/0137697 A1* | 6/2007 | Kempa et al. | 136/256 |
| 2008/0047604 A1* | 2/2008 | Korevaar et al. | 136/258 |
| 2008/0110486 A1* | 5/2008 | Tsakalakos et al. | 136/244 |
| 2008/0135089 A1* | 6/2008 | Tsakalakos et al. | 136/248 |

FOREIGN PATENT DOCUMENTS

| | | |
|---|---|---|
| WO | WO 2005/051435 A1 | 6/2005 |
| WO | WO 2006/025627 A1 | 3/2006 |
| WO | WO 2006/054240 A2 | 5/2006 |

OTHER PUBLICATIONS

Braune et al., "Tantalum oxide nanomers for optical applications", SPIE Conf. on Org./Inorg. Hybrid Mat. for Photonics, San Diego, CA, (Jul. 1998), pp. 124-132.

Parraud et al., "Stabilization and Characterization of Nanosized Niobium . . . " 75 (8) J. Am. Ceram. Soc. (1992), pp. 2289-2292.

Yu et al., "Metal-Based X-ray Contrast Media", 99 Chem. Rev. (1999), pp. 2353-2377.

Li et al., "A Novel Simple Route to Synthesize Aqueous Niobium and Tantalum Precursors . . . ", 942 Mater. Res. Soc. Symp. Proc. (2006).

Tomita et al., "A Water-Soluble Titanium Complex for the Selective Synthesis of Nanocrystalline . . . ", 45 Angew. Chem. Int. Ed. (2006), pp. 2378-2381.

Kominami et al., "Solvothermal synthesis of tantalum(v) oxide nanoparticles and their photocatalytic activities.", 3 Phys. Chem. Chem. Phys. (2001), pp. 2697-2703.

Sun et al., "Sol-Gel Chemistry of Tantala HR Coatings: Structure and Laser-Damage Resistance", 8 J. Sol-Gel Sci & Tech. (1997), pp. 493-497.

Ozer et al., "Structural and Optical Properties of Sol-Gel Deposited Proton Conducting Ta2O5 Films", 8 J. Sol-Gel Sci. & Tech. (1997), pp. 703-709.

Romero et al., "Synthesis of Ta2O5 Nanorods in the Presence of Poly L-Lysine by a Sol-Gel Process", 95 Annali de Chimica (2005), pp. 703-707.

Yordanov et al., "Novel Iodinated Dendritic Nanoparticles for Computed Tomography (CT) Imaging", 2(6) Nano Letters (2002), pp. 595-599.

Bonnemann et al., "Nanoscopic Metal Particles—Synthetic Methods and Potential Applications", Eur. J. Inorg. Chem. (2001), pp. 2455-2480.

Monreal et al., "Synthesis of nanoparticles of tantalum(v) oxide in presence of D-galactose 3,6 anhydro-L-galactose", 27(1/2) Int. J. Mat. Prod. Tech. (2006), pp. 80-84.

Fang et al., "Surface sol-gel synthesis of ultrathin titanium and tantalum oxide films", 1 J. Nanoparticle Res. (1999), pp. 43-49.

Li et al., "Effect of Substrate Temperature on the Growth and Photoluminescence Properties of Vertically Aligned ZnO Nanostructures", Journal of Crystal Growth, vol. 292, pp. 19-25, 2006.

Ng et al., "Growth of Epitaxial Nanowires at the Junctions of Nanowalls", Science, vol. 300, p. 1249, May 23, 2003.

Kobayashi et al., "Nanographite Domains in Carbon Nanowalls, Journal of Applied Physics, American Institute of Physics, vol. 101, pp. 094306-1-094306-4, 2007."

Kim et al., "Epitaxial Growth of ZnO Nanowall Networks on GaN/Sapphire Substrates", Applied Physics Letters, American Institute of Physics, vol. 90, pp. 033107-1-033107-3, 2007.

He et al., "Electrochemical Synthesis of Porous Cobalt Nanowall Arrays", Institute of Physics Publishing, Nanotechnology, vol. 17, pp. 3512-3517, 2006.

Li et al., "Synthesis and Photoluminescence Properties of Vertically Aligned ZnO Nanorod-Nanowall Junction Arrays on a ZnO-Coated Silicon Substrate", Institute of Physics Publishing, Nanotechnology, vol. 17, pp. 3740-3744, 2006.

State Intellectual Property Office, P.R. China, Unofficial English Translation of First Office Action issued on Jan. 17, 2011, 7 pages.

* cited by examiner

NANOWALL SOLAR CELLS AND OPTOELECTRONIC DEVICES

RELATED APPLICATIONS

This present application is related to commonly-assigned co-pending application U.S. Ser. No. 11/599,722, filed Nov. 15, 2006, entitled "Graded Hybrid Amorphous Silicon Nanowire Solar Cells" and co-pending application U.S. Ser. No. 11/599,677, filed Nov. 15, 2006, entitled "Amorphous-Crystalline Tandem Nanostructured Solar Cells."

TECHNICAL FIELD

The present invention relates generally to solar cells and optoelectronic devices, and more specifically to such devices that include photoactive junctions assembled conformally over nanowall structures, wherein the nanowall structure may be part of a photoactive junction.

BACKGROUND INFORMATION

Presently, silicon (Si) is the most commonly used material in the fabrication of solar cells, such solar cells being used for converting sunlight into electricity. Single and multi-junction p-n solar cells are used for this purpose, but none are efficient enough to significantly reduce the costs involved in the production and use of this technology. Consequently, competition from conventional sources of electricity precludes the widespread use of such solar cell technology.

Most electronic and optoelectronic devices require the formation of a junction. For example, a material of one conductivity type is placed in contact with a different material of the opposite conductivity type to form a heterojunction. Alternatively, one may pair differentially doped layers made of a single material type to generate a p-n junction (or homojunction). Abrupt band bending at a heterojunction due to a change in conductivity type and/or variations in band gap may lead to a high density of interface states that result in charge carrier recombination. Defects introduced at the junction during fabrication may further act as sites for charge carrier recombination that degrade device performance.

While the ideal thermodynamic efficiency of a solar converter is ~85%, there is a loss in efficiency due to the fact that sub-bandgap energy photons in the solar spectrum are not absorbed. This loss alone, when applied with black-body radiation, limits the conversion efficiency of a single junction cell to about 44% (the so-called ultimate efficiency). Further taking into account the real solar spectrum normalized to a black body temperature, the temperature of the solar cell, the shape of the solar cell, the cell's refractive index, and the diode equations, Shockley and Queisser were able to show that the performance of a single junction cell was limited to just over 30 percent efficiency for an optimal cell with a bandgap of 1.45 electron volts (eV) and under 1 sun illumination, and just over 40% for maximum concentration (Shockley and Queisser, "Detailed Balance Limit of Efficiency of p-n Junction Solar Cells," J. Appl. Phys., 1961, 32(3), pp. 510-519). More recent calculations have shown this "detailed balance limit efficiency" for a single junction to be 29 percent (Kerr et al., "Lifetime and efficiency of limits of crystalline silicon solar cells," Proc. 29$^{th}$ IEEE Photovoltaic Specialists Conference, 2002, pp. 438-441). Additionally, recombination of photo-generated electrons and holes with trap states in the semiconductor crystal associated with point defects (interstitial impurities), metal clusters, line defects (dislocations), planar defects (stacking faults), and/or grain boundaries further reduces the efficiency. Although this latter reduction in efficiency can be overcome by using other materials with appropriate properties (particularly long diffusion lengths of the photo-generated carriers), this still does not bring this technology to a cost parity with more conventional sources of electricity.

Defect states due to structural imperfections or impurity atoms can reside on the surface and within the bulk of monocrystalline semiconductors. In addition, polycrystalline semiconductor materials are comprised of randomly-oriented crystal grains with grain boundaries, the grain boundaries inducing a large number of bulk and surface defect states. Because charge carriers can recombine at defect sites and are therefore lost as current carriers, defects typically adversely affect the operation or performance of electronic and/or optoelectronic devices such as solar cells. Accordingly, the surfaces of monocrystalline or polycrystalline semiconductor substrates are often passivated during device fabrication in order to minimize the negative effects of surface defects. One method for surface passivation is by forming a layer of intrinsic (undoped) amorphous semiconductor material on the monocrystalline or polycrystalline semiconductor substrate. This decreases the recombination of charge carriers at the substrate surface and improves the performance of the device.

The absorption capacity of the materials making up a PV device may also affect the efficiency of the cell. A p-i-n thin film solar cell having an i-type semiconductor absorber layer formed of a variable bandgap material, said i-layer being positioned between a p-type semiconductor layer and an n-type semiconductor layer has been described. See U.S. Pat. No. 5,252,142. A variable bandgap i-layer absorber provides for improved photoelectric conversion efficiency.

Multi-junction solar cells have been demonstrated to have improved efficiencies as well. The improved performance may be achieved by incorporating stacked junctions with differing band gaps to capture a broader area of the light spectrum. Such devices are typically constructed with stacked p-n junctions or stacked p-i-n junctions. Each set of junctions in this array is often referred to as a cell. A typical multi-junction solar cell includes two or three cells stacked together. The optimal bandgaps and theoretical efficiencies for multi-junction solar cells as a function of the number of cells in the stack has been analyzed theoretically by Marti and Araujo (A. Marti and G. L. Araujo, Sol. Ener. Mater. Sol. Cells, 1996, 43(2), pp. 203-222).

Nanostructures

Silicon nanowires have been described in p-n junction diode arrays (Peng et al., "Fabrication of large-Area Silicon Nanowire p-n Junction Diode Arrays," Adv. Mater., 2004, vol. 16, pp. 73-76). Such arrays, however, were not configured for use in photovoltaic devices, nor was it suggested how such arrays might serve to increase the efficiency of solar cells.

Silicon nanostructures have been described in solar cell devices (Ji et al., "Silicon Nanostructures by Metal Induced Growth (MIG) for Solar Cell Emitters," Proc. IEEE, 2002, pp. 1314-1317). In such devices, Si nanowires can be formed, embedded in microcrystalline Si thin films, by sputtering Si onto a nickel (Ni) pre-layer, the thickness of which determines whether the Si nanowires grow inside the film or not. However, such nanowires are not active photovoltaic (PV) elements; they merely serve in an anti-reflective capacity.

Solar cells comprising silicon nanostructures, where the nanostuctures are active PV elements, have been described in commonly-assigned co-pending U.S. patent application Ser. No. 11/081,967, filed Mar. 16, 2005. In that particular Application, the charge-separating junctions are largely contained within the nanostructures themselves, generally requiring doping changes during the synthesis of such nanostructures.

Nanowall synthesis has been described with a variety of materials including metal oxides and carbon. Incorporation of such structures into electronic devices has been limited to the growth of nano-rods/wires at the junctions of nanowalls (Ng et al., "Growth of Epitaxial Nanowires at the Junctions of Nanowalls," Science, 2003, 300, p. 1249).

As a result of the foregoing, incorporating intrinsic amorphous layers to reduce the effects of surface defects and/or the use of multi-junction cells over a nanostructured scaffold, such as a nanowall, may lead to solar cells with efficiencies on par with the more traditional sources of electricity. Thus, there is a continuing need to explore new configurations for PV devices. This is especially the case for nanostructured devices, which may benefit from enhanced light trapping and shorter paths for charge transport upon light absorption.

SUMMARY OF THE INVENTION

In some embodiments, a photovoltaic device includes a substrate and a nanowall structure disposed on the substrate surface. The device also includes at least one layer conformally deposited over the nanowall structure. The layer(s) is(are) at least a portion of a photoactive junction.

In some embodiments, a method for making a photovoltaic device includes generating a nanowall structure on a substrate surface and conformally depositing at least one layer over the nanowall structure thereby forming at least one photoactive junction.

In some embodiments, a solar panel includes at least one photovoltaic device based on a nanowall structure. The solar panel isolates such devices from its surrounding atmospheric environment and permits the generation of electrical power.

The foregoing has outlined rather broadly the features of the present invention in order that the detailed description of the invention that follows may be better understood. Additional features and advantages of the invention will be described hereinafter, which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 1b shows a representative partial cross-sectional view of FIG. 1a.

DETAILED DESCRIPTION OF THE INVENTION

Figure 1B:
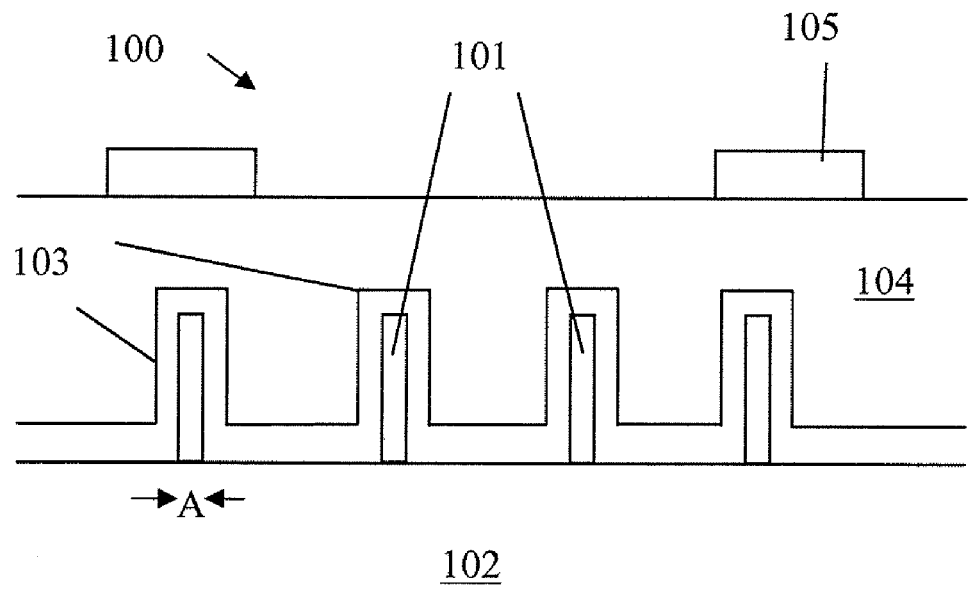

In some embodiments, the present invention is directed to photovoltaic (PV) devices, which may include nanowall structures and at least one layer conformally disposed on the nanowalls. Each layer may be at least a portion of photoactive junction.

In some embodiments, a single amorphous layer may be compositionally graded across its thickness from substantially intrinsic at the interface with the nanowall structure to substantially conductive at the opposite side. A heterojunction may be formed when the amorphous layer is compositionally graded to the opposite conductivity type as that of the nanowall.

In alternate embodiments, multiple layers may be conformally coated over the nanowall structure. In this arrangement, the combined layers may include a plurality of photoactive junctions, such as p-n and p-i-n junctions. These photoactive junctions may be stacked with tunnel junctions separating each cell in the multi-junction array. Each cell in the multi-junction array may be arranged in series and may include p-n junctions, p-i-n junctions, and combinations thereof. In some embodiments, the nanowalls may be part of a first photoactive junction and be appropriately doped as the p-layer or n-layer. In alternate embodiments, the nanowalls may be conducting and, thus, not a part of a photoactive junction. In such embodiments, the nanowall may serve as a contact.

In the following description, specific details are set forth such as specific quantities, sizes, etc. so as to provide a thorough understanding of embodiments of the present invention. However, it will be obvious to those skilled in the art that the present invention may be practiced without such specific details. In many cases, details concerning such considerations and the like have been omitted inasmuch as such details are not necessary to obtain a complete understanding of the present invention and are within the skills of persons of ordinary skill in the relevant art.

Referring to the drawings in general, it will be understood that the illustrations are for the purpose of describing a particular embodiment of the invention and are not intended to limit the invention thereto.

While most of the terms used herein will be recognizable to those of skill in the art, the following definitions are nevertheless put forth to aid in the understanding of the present invention. It should be understood, however, that when not explicitly defined, terms should be interpreted as adopting a meaning presently accepted by those of skill in the art.

A "photovoltaic device," as defined herein, is a device comprising at least one photodiode and which utilizes the photovoltaic effect to produce an electromotive force (e.m.f.). See Penguin Dictionary of Electronics, Third Edition, V. Illingworth, Ed., Penguin Books, London, 1998. An exemplary such device is a "solar cell," wherein a solar cell is a photodiode whose spectral response has been optimized for radiation from the sun.

"Nanoscale," as defined herein, generally refers to dimensions below 1 μm.

"Nanostructures," as defined herein, generally refer to structures that are nanoscale in at least one dimension.

"Nanowalls," as defined herein, are nanostructures that are nanoscale in at least one dimension. They typically comprise a random array of closed cell-like structures grown from a substrate surface or etched from a wafer-like substrate. The walls may be created at variable angles relative to the plane of the substrate whether etched or grown in a bottom-up approach. Thus, the walls may range from being substantially perpendicular to about 5-30 degree angles relative to the substrate plane. Examples of such structures synthesized from ZnO or carbon, for example, are known in the art.

"Conformal," as defined herein, pertains to coatings that largely adopt (i.e., conform to) the shape of the structures that they coat. This term should be interpreted broadly, however, permitting the substantial filling of void space between the coated structures—at least in some embodiments. A single conformal layer may vary in thickness along different sections of the structure being coated.

"Semiconducting material," as defined herein, is material that has a conductivity that is generally intermediate between metals and insulators, and wherein such a material has an energy gap, or "bandgap," between its valence and conduction bands. In its pure, undoped state, such semiconducting material is typically referred to as being "intrinsic."

"p-doping," as defined herein, refers to doping of semiconducting material with impurities that introduce holes effective for increasing the conductivity of the intrinsic semiconducting material and moving the Fermi level towards the valence band such that a junction can be formed. An exemplary such p-doping is the addition of small quantities of boron (B) to silicon (Si).

"n-doping," as defined herein, refers to doping of semiconducting material with impurities that introduce electrons effective for increasing the conductivity of the intrinsic semiconducting material and moving the Fermi level towards the conduction band such that a junction can be formed. An exemplary such n-doping is the addition of small quantities of phosphorous (P) to silicon (Si).

"Compositionally-graded," as defined herein and relating to the conformal amorphous layer of the PV devices described herein, means that the bulk semiconductor material comprises a dopant concentration that varies across the thickness of the layer such that it is substantially intrinsic at the interface with the elongated nanostructures (having a doping of a first type, e.g., p-doping) and progressively more heavily doped (with a dopant of a second type, e.g., n-doping) across the thickness of the layer such that on the opposite side it has a doping level that is sufficient to establish a charge separating junction in the PV device within which it resides. "Compositionally-graded hybrid," as defined herein and relating to the PV devices described herein, means that a compositionally-graded amorphous layer occurs in conjunction with the underlying silicon nanostructures A "charge-separating junction," as defined herein, comprises a boundary between materials of different type (e.g., differing dopants and/or bulk composition) that allows for the separation of electrons and holes due to the presence of a potential barrier and electric field gradient.

A "heterojunction," as defined herein and pertaining to photovoltaic devices, is a charge-separating junction established via the contact of two differing semiconductor materials having differing bandgaps.

"Active PV elements," as defined herein, are those elements of a PV device responsible for charge generation and charge separation establishing a charge-separating junction.

A "p-n photovoltaic device," as defined herein, is a device comprising at least one photodiode comprising a charge-separating junction established via the contact of a p-doped semiconductor and an n-doped semiconductor.

A "p-i-n photovoltaic device," as defined herein, is a stack of three materials with one layer being doped p-type (primarily hole conduction), one being undoped (i.e., intrinsic), and the other being doped n-type (primarily electron conduction).

"Multi-junction," as defined herein, is a tandem array of stacked photoactive junctions which may include p-n and/or p-i-n junctions. Each photoactive junction may be separated from its neighboring cell by a tunnel junction.

"Solar cell," as defined herein, is essentially a photovoltaic device for energy conversion from solar radiation.

"Nanotemplates," as defined herein, are inorganic or organic films comprising an array of pores or columns having nanoscale dimensions. The pores generally run through the film in a substantially perpendicular direction relative to the plane of the film.

Devices

Figure 1A:
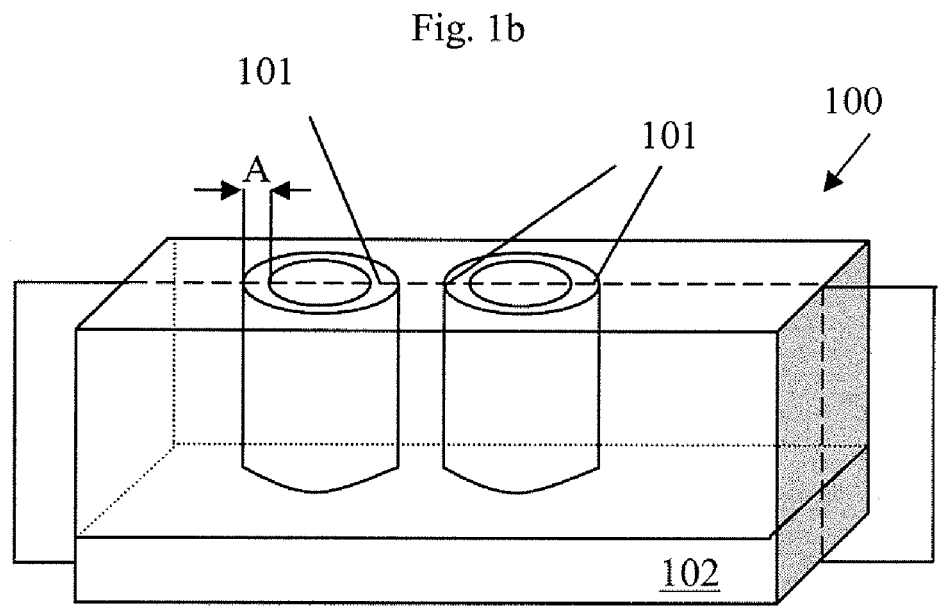
FIG. 1a shows a partial view of a photovoltaic device, in accordance with one embodiment of the present invention.

Referring to FIG. 1a and cross-sectional view 1b, in some embodiments, the present invention is directed to a nanowall-based photovoltaic device 100 which may include:

(a) nanowalls 101 disposed on a substrate 102. Nanowalls 101 may be a semiconductor. They may be p-doped semiconductors, in one embodiment and n-doped semiconductors, in another embodiment. Alternatively, they may be degenerately doped silicon and other metallic material to serve as conductors. In some embodiments they may be a transparent conducting oxide; and (b) at least one layer 103 disposed conformally about the nanowalls 101. Layer 103 may constitute at least a portion of a photoactive junction, in one embodiment. In some embodiments, the photoactive junction may be a p-n junction and, in other embodiments, the photoactive junction may be a p-i-n junction. Thus, in some embodiments, layer 103 may comprise any one of a p-layer, an i-layer, an n-layer, and a tunnel junction.

In some embodiments, a layer of transparent conductive material (TCM) 104 is deposited over the multilayered film 103. TCM 104 may substantially fill the spaces between the plurality of nanowalls. One skilled in the art will recognize, however, that TCM 104 need not form a flat surface and may also be conformally disposed about the array of nanostructures. Additionally, TCM 104 may form a nominally flat surface over the top of the plurality of nanowalls. Furthermore, top 105 and bottom (not shown) contacts are typically provided operable for connecting the device to an external circuit, wherein the bottom electrode is typically (but not always) integrated with the substrate (vide infra).

Optionally, the nanowall structure may be built on opposing faces of the substrate in a bifacial presentation.

Nanowall Structure

The nanowalls 101 typically have a thickness A in the range of from about 10 nm to about 1000 nm, and a height of a few microns. In some embodiments, the nanowalls may be arranged on substrate 102 in a substantially vertical orientation, relative to the plane of substrate 102. In some embodiments the nanowalls may be at angles other than substantially perpendicular relative to the plane of substrate 102. Furthermore, one skilled in the art will recognize the benefit of incorporating nanowalls at angles less than 90 degrees relative to the plane of substrate 102 in order to optimize light absorption. In other embodiments, the nanowalls 101 are disposed on the substrate 102 in a largely random manner at angles between 0 and 85 degrees relative to the plane of substrate 102. One skilled in the art will recognize that FIGS. 1a and 1b are merely exemplary and the actual structure may be more complex. The walls may form a honeycomb like structure, for example, rather than the simple cylindrical forms shown. The void spaces may vary in size and shape substantially. The nanowall structure can be described as a network of connected wall structures. In general, the network of nanowalls may be formed in a manner that resembles a continuous web-like structure of closed cells (the exact structure will be given more meaning in light of the accompanying experimental figures, vide infra). Finally, the distance between the walls is less than the wavelength of the incident light to minimize scattering.

Nanowalls 101 may be of any material which suitably provides for a photovoltaic device, in accordance with various embodiments. Suitable semiconductor materials may include, but are not limited to, silicon (Si), silicon germanium (SiGe), germanium (Ge), gallium arsenide (GaAs), indium phosphide (InP), GaInP, GaInAs, indium gallium arsenide (InGaAs), indium nitride (InN), selenium (Se), cadmium telluride (CdTe), Cd—O—Te, Cd—Mn—O—Te, ZnTe, Zn—O—Te, Zn—Mn—O—Te, MnTe, Mn—O—Te, oxides of copper, carbon, Cu—In—Ga—Se, Cu—In—Se, and combinations thereof. Suitable conducting materials include, but are not limited to, degenerately doped silicon, metallic materials such as aluminum (Al), platinum (Pt), palladium (Pd), and silver (Ag), doped ZnO, and combinations thereof. Any other material from which nanowalls may be constructed may also be used. In some embodiments, the nanowall material may be substantially the same as the substrate material.

The Conformal Layers

Figure 2:
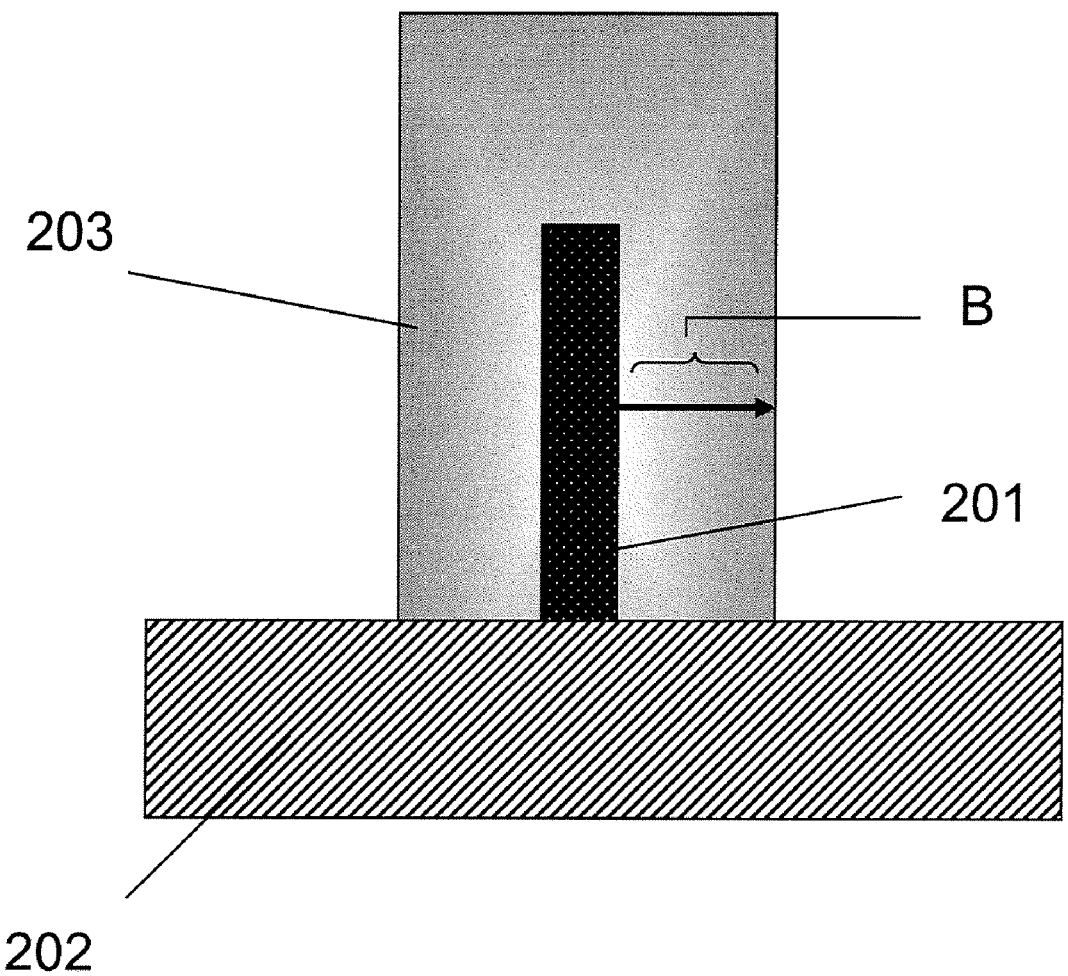
FIG. 2 shows a partial cross-sectional view of a nanowall junction device with a compositionally graded amorphous layer, in accordance with one embodiment of the present invention.

With reference to the cross-sectional view of FIG. 2, in some embodiments, a layer 203 may be compositionally-graded (in terms of dopant concentration) across its thickness B, wherein the dopant concentration typically increases from almost zero near the nanowall 201 (the nanowall being a semiconductor of a first doping type) and surface 202 to an amount sufficient to establish a charge separating junction at opposite side of the layer. Typically, such doping is n-doping comprising n-dopants (e.g., N, P, As, etc.), but such doping could alternatively be p-doping in the situation where the nanowall 201 is n-doped.

In some embodiments, there may be a plurality of conformally deposited layers. In this arrangement, a particular amorphous layer may include compositions that are p-doped and n-doped semiconductors. Non-doped layers may also be incorporated, and may include an intrinsic layer and a layer acting as a tunnel junction. In one embodiment, multiple amorphous layers may constitute cells of stacked p-n junctions. In another embodiment, multiple amorphous layers may constitute cells of stacked p-i-n junctions. In yet another embodiment, multiple amorphous layers may constitute a combination of stacked p-n and p-i-n junctions. In some embodiments, the cells may be separated by a layer serving as tunnel junction (vide infra).

The composition of the amorphous layer may be amorphous silicon (a-Si), amorphous silicon-germanium (a-SiGe), nanocrystalline silicon (nc-Si) and amorphous silicon carbide (a-SiC), for example. In one embodiment, such materials may be ordered about the nanowalls in layers of increasing band gap energy.

Typically, the combined deposited layers may have a thickness in the range from 5 Å to 50,000 Å. In embodiments with multiple amorphous layers, the thickness of an individual layer may be difficult to determine, however, the thickness may be adjusted to optimize current matching between junctions of different band gap energies. That is, the thickness of a given layer may be chosen so that the photocurrents generated in each individual cell (i.e. each photoactive junction) are substantially equivalent.

In some embodiments, one of a plurality of layers may include a tunnel junction. In such a case, the material composition may be a metal oxide, for example zinc oxide, or a highly doped amorphous Si layer.

Device Structures

Figure 3:
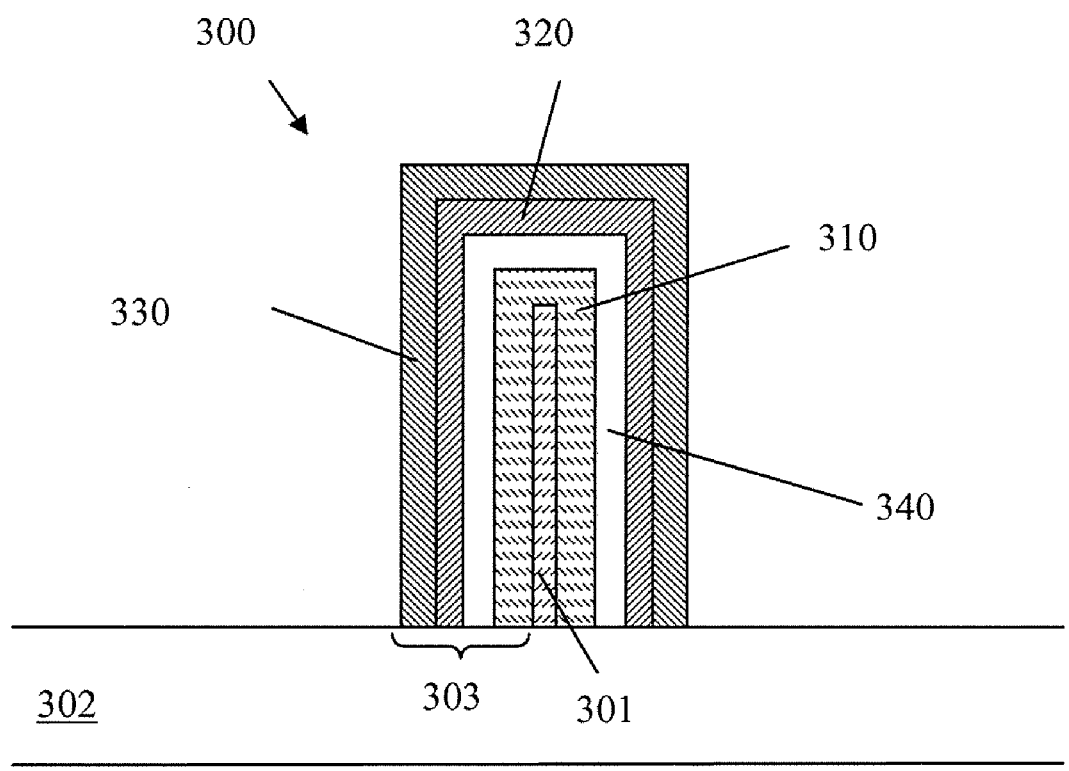
FIG. 3 shows a partial cross-section view of a nanowall junction device with two p-n junctions, wherein the nanowall is part of the bottom junction, in accordance with one embodiment of the present invention.

Structures more complex than the compositionally-graded device described above may be fabricated. In some embodiments, the nanowalls may be semiconductors having a doping of a first type, which may be n-doping, although it could also be p-doping. To generate a photoactive junction within the device, however, the doping of the nanowalls should be opposite that of at least one amorphous layer. FIG. 3 shows a cross-sectional view of a simple multiple p-n junction device 300 disposed on substrate 302, in accordance with one embodiment of the invention. Referring to FIG. 3, nanowall 301 may be an n-doped semiconductor, for example, and integrated as the first element of a first p-n junction (a first cell) which includes a first p-doped layer 310. A second p-n junction, may include n-doped layer 320 and p-doped layer 330, which is separated by tunnel junction 340. Each of the plurality of layers 303 may be deposited sequentially and conformally about the nanowall 301. One skilled in the art will recognize the benefit of varying the band gap between the two junctions to capture light of varied wavelength. In some embodiments, there may be intrinsic layers between the p-layers and n-layers, thus defining p-i-n junctions.

Figure 4:
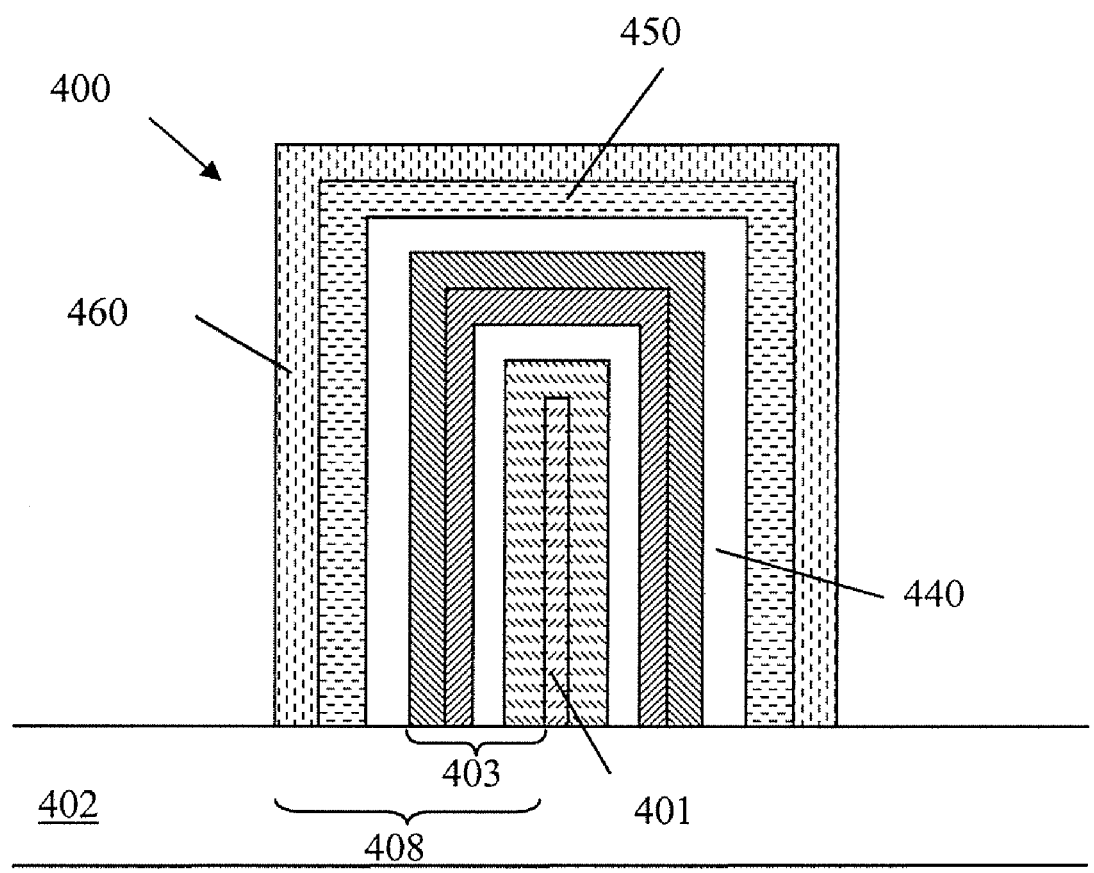
FIG. 4 shows a partial cross-section view of a nanowall junction device with three p-n junctions, wherein the nanowall is part of the bottom junction, in accordance with one embodiment of the present invention.

Referring to the cross-sectional view of FIG. 4, in another embodiment, one may add additional layers to multilayered film 403 (cf. 303, FIG. 3) deposited about nanowall 401 to create a new multilayer film 408. The additional layers may include another tunnel junction 440. Furthermore, there may be a third p-n junction including p-doped layer 450 and n-doped layer 460. In principle, any number of layers may be added to create any number of p-n junctions with intervening tunnel junctions. The number of such stacked photoactive junctions may be dependent on the thickness that each layer introduces relative to the void space of the cell-like structure formed on substrate 402 and by the ability to assure current matching. Thus, each photoactive junction (i.e. cell) may have component layers with a thickness that depends on the band gap energies of the materials to assure substantially equivalent photocurrents between each cell. Again, in some embodiments, intrinsic layers may be incorporated to define p-i-n junctions.

Further, FIG. 4 illustrates a multi-junction device having doped crystalline silicon (c-Si) as the base cell in accordance with one embodiment of the present invention. The bottom cell may include a semiconducting doped nanowall 401 and the first conformally deposited layer (cf. FIG. 3, 310) about the nanowall with opposite doping. The outermost (top cell), which includes layers 450 and 460 may be substantially amorphous silicon. Finally, the middle cell (cf. FIG. 3, 320/330), may be of a material with intermediate band gap energy, such as amorphous silicon germanium (a-SiGe). In another embodiment, the cells stacked from bottom to top may be c-Si, a-SiGe, and amorphous silicon carbide (a-SiC), respectively.

Figure 5:
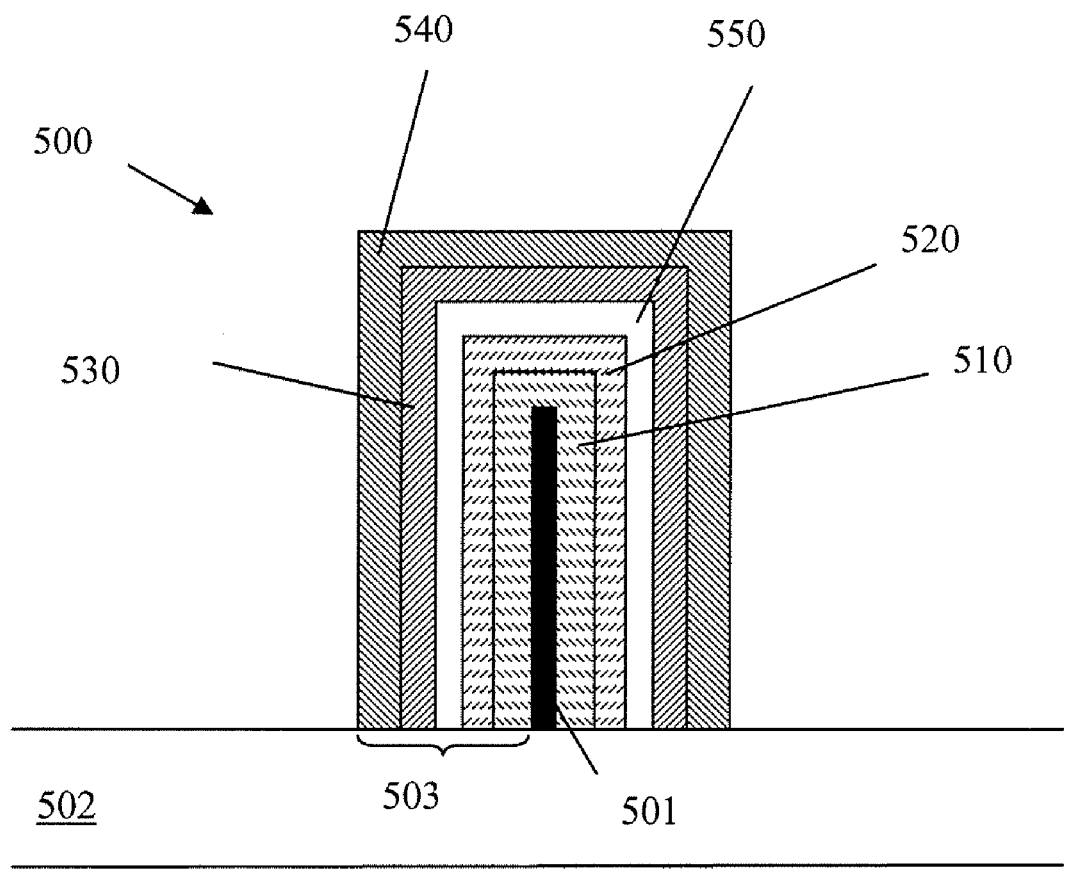
FIG. 5 shows a partial cross-section view of a nanowall junction device with two p-n junctions, wherein the nanowall is a conductor, in accordance with one embodiment of the present invention.

As shown in the cross-sectional view of FIG. 5, the nanowall 501 of device 500 may be a conductor and not part of the stacked multi-junction structure. In this embodiment, nanowall 501 may serve as an electrode disposed on substrate 502. A plurality of amorphous layers 503 may include a first p-n junction (with a first p-doped layer 510 and a first n-doped layer 520), a second p-n junction (with a second p-doped layer 530 and a second n-doped layer 540), and a tunnel junction 550 in between the first p-n junction and the second p-n junction. While this embodiment describes device 500 having two p-n junctions, one of ordinary skill in the art will recognize that three or more p-n junctions (with appropriate tunnel junctions interspersed) may be stacked about nanowall 501. In additional embodiments, any number of p-n junctions may be stacked. Again spatial limitations and current matching may be limiting factors in determining the exact number of p-n junctions that may be incorporated. As in previous embodiments, intrinsic layer may be incorporated between p- and n-layers to generate the corresponding p-i-n junctions.

For illustrative purposes, the following configurations of materials may be used in a three-cell (each cell comprising a photoactive junction) device, in accordance with embodiments in which the nanowall 501 is conducting. The bottom cell (cf. FIG. 5), which includes 510 and 520, may be a-SiGe. The middle cell, which includes 530 and 540, may be a-SiGe with a different ratio of Si:Ge to obtain an intermediate band gap energy. Finally, a top cell (not shown) disposed conformally about the middle cell, may be a-Si. Another configuration of three materials, expressed from bottom cell to top cell may include, for example, nanocrystalline silicon (nc-Si), a-Si layer (intermediate band gap energy by varying hydrogen content), and a-Si. In yet another configuration, the bottom cell may be nc-Si, the middle cell a-SiGe, and top cell a-Si. One of ordinary skill in the art will recognize that any set of three materials which lend themselves to appropriate doping to generate photoactive junctions may form stacked cells. For example, each of the top cells described above may have a-SiC in lieu of a-Si as the bulk material.

Figure 6:
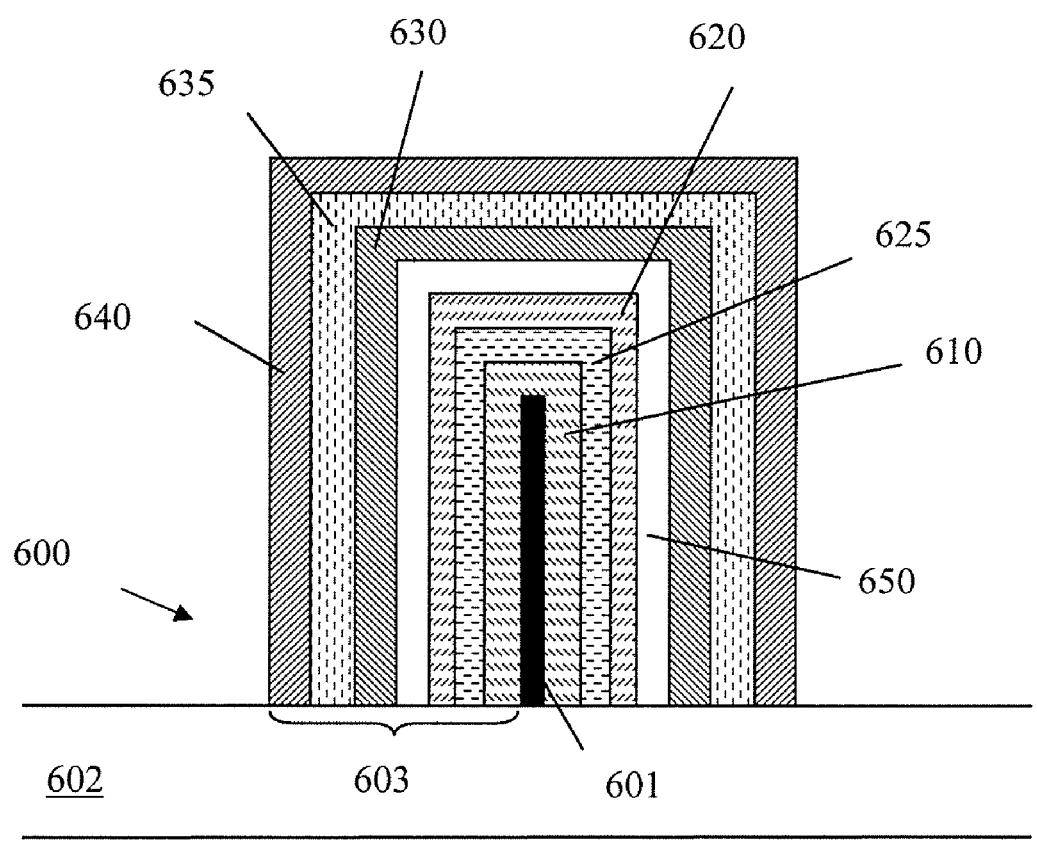
FIG. 6 shows a partial cross-section view of a nanowall junction device with two p-i-n junctions, wherein the nanowall is a conductor, in accordance with one embodiment of the present invention.

As previously illustrated, the devices may have stacked p-n junctions. As shown in the cross-sectional view of FIG. 6, the devices may instead include conducting nanowalls 601 on substrate 602 that serve as a scaffold to conformally deposit stacked p-i-n junctions as well. Device 600 may include a plurality of amorphous layers 603 that defines two stacked p-i-n junctions. The first such junction includes a first n-doped layer 610, a first intrinsic layer 625, and a first p-doped layer 620. Likewise, the second junction includes a second n-doped layer 630, a second intrinsic layer 635, and a second p-doped layer 640. The first and second p-i-n junctions are separated by tunnel junction 650. Although device 600 shows a device with 2 stacked p-i-n junctions, one of ordinary skill in the art will recognize that any number of p-i-n junctions may be stacked about the elongated nanostructure 601 within the constraints outline above.

Figure 7:
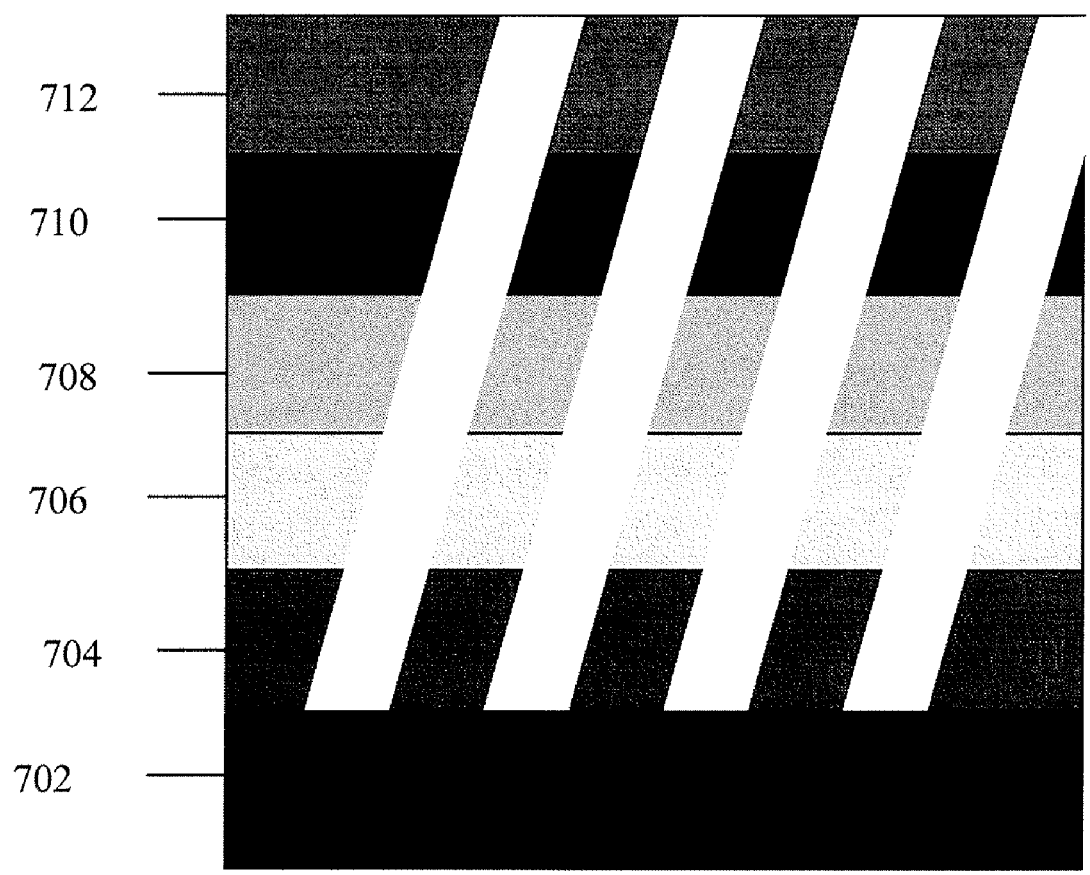
FIG. 7 shows a cross sectional view of a nanowall structure in which the photoactive junctions are part of the wall structure, in accordance with one embodiment of the present invention.

While most embodiments describe an approach building from the bottom-up using successive deposition of conformal layers, an alternative embodiment shown in FIG. 7 shows a nanowall structure in which the active junctions are part of the wall itself. Such a structure may be achieved by etching a multilayered film, for example. Substrate 702 is at the base of the structure. A simple tandem p-n junction is shown in which a first layer 704 has a first doping and 706 a second doping of the opposite type. 708 is a tunnel junction layer. Finally, layers 710 and 712 define a further p-n junction. In alternate embodiments any number of junctions may be constructed in this manner. Additionally, the p-layers and n-layers may be separated by intrinsic layers to define a p-i-n type junction. Finally, one skilled in the art will recognize that each cell should be of varied band gap energy to optimize light absorption at different wavelengths. One skilled in the art will recognize the ability to place different junction types within the walls, thus creating tandem multi-junction arrays within the wall network.

In yet another embodiment, the nanowall structure may placed on top of at least one photoactive junction. This may be accomplished by incorporation of a multilayered film disposed between the nanowall and the substrate. The multilayered film would include the elements of at least one p-n junction, p-i-n junction, or combinations thereof, in a manner analogous to the successive conformal layers over the nanowalls. The only difference is that such layers would be built over the substrate prior to placement of the nanowalls.

In device embodiments employing a layer of transparent conductive material, the transparent conductive material can be a transparent conductive oxide (TCO). In some embodiments, the transparent conductive oxide is indium-tin-oxide (ITO). In some other such embodiments, the transparent conductive oxide is doped ZnO. Typically, the transparent conductive material has a thickness between about 0.05 μm and about 1 μm.

In some embodiments, the substrate provides a bottom contact. In some embodiments, the layer of transparent conductive material provided with a top contact. Depending on the intended use, the device can be configured for either top and/or bottom illumination.

Device Fabrication

Figure 8:
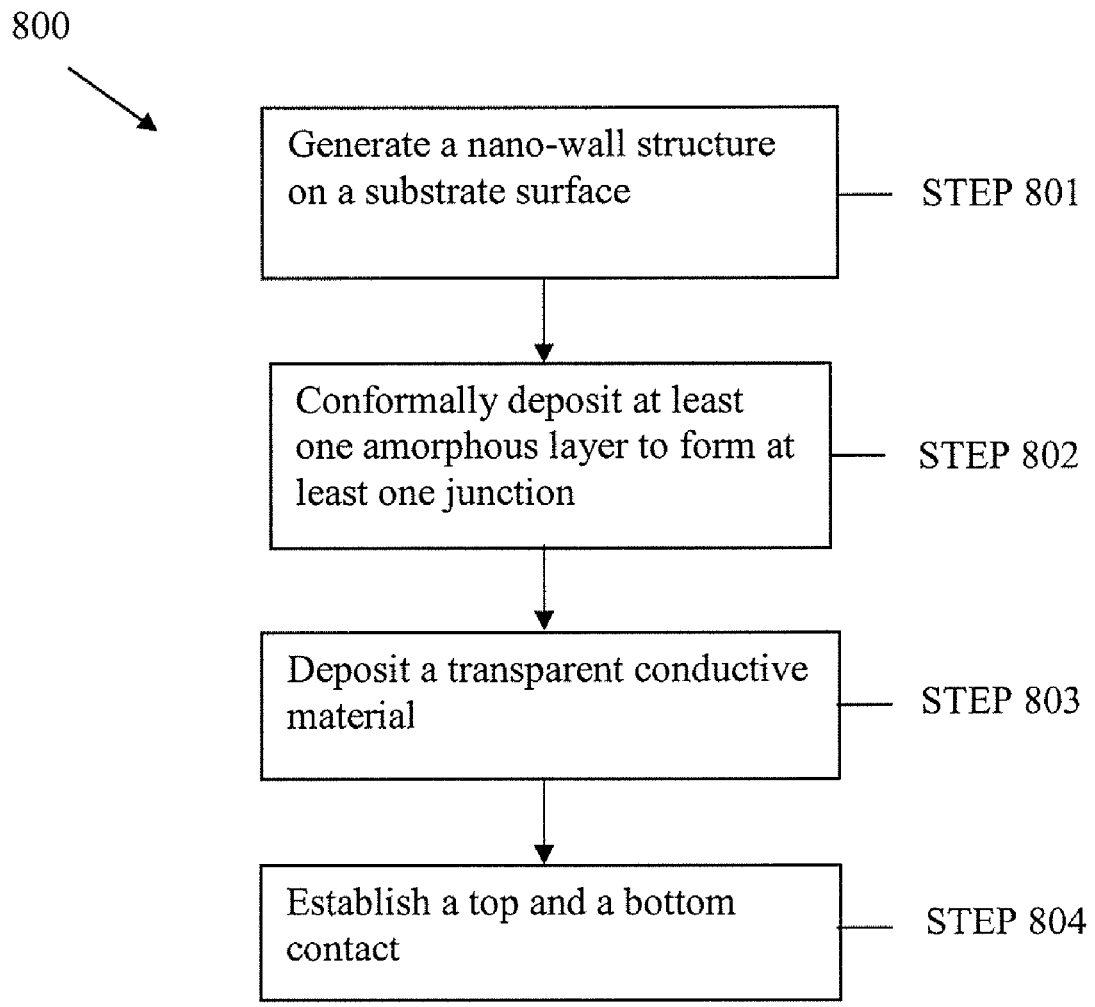
FIG. 8 shows a flow diagram for a method of making a nanowall-based photovoltaic device, in accordance with one embodiment of the present invention.

In some embodiments, the present invention is directed to a method 800 in FIG. 8 for making the above-described nanowall-based photovoltaic devices, in accordance with one embodiment of the present invention. Referring to FIG. 8, in conjunction with FIGS. 2-6 nanowalls are generated on a substrate in step 801. The nanowalls are a semiconductor (FIGS. 2-4) in some embodiments, and a conductor (FIGS. 5-6) in other embodiments; (Step 802) at least one layer is conformally-deposited on the nanowalls, the materials of each layer having appropriate doping in some embodiments. They may also be intrinsic or serve as a tunnel junction in other embodiments; such layering generates one or more p-n, p-i-n, and tunnel junctions. (Step 803) a transparent conductive material (TCM) is deposited as a layer on the multilayer film; and (Step 804) top and bottom contacts are established, which may be operable for connection of the device to an external circuit. The top contact may be disposed on the TCM and the bottom contact may be disposed on a surface of the substrate opposite the nanowalls or integrated within the substrate.

Nanowall Synthesis

In some embodiments, the nanowalls may be provided by a method that includes wet and dry etching techniques. For example, performing a wet etch on a material disposed on the substrate may provide a material with a first nanostructure. Wet etch techniques include, but are not limited to, galvanic etching (with $AgNO_3/HF$), which may provide a high density nanostructure. After wet etching, an oxide layer may be deposited over the etched material and then a nickel layer may be deposited over the oxide layer. Next, a dry etch may be carried out to form a coated nanowall structure. Finally, the remaining nickel and oxide layers may be removed to provide the nanowall structure.

In some embodiments, the nanowalls are provided by growing them via a method selected from the group consisting of chemical vapor deposition (CVD), metal-organic chemical vapor deposition (MOCVD), plasma-enhanced chemical vapor deposition (PECVD), hot wire chemical vapor deposition (HWCVD), atomic layer deposition, electrochemical deposition, solution chemical deposition, and combinations thereof. In some embodiments, the nanowalls are provided by catalytically growing them from metal nanoparticles, where the metal nanoparticles are disposed on the surface of the substrate and wherein the metal nanoparticles may include a metal selected from the group consisting of gold (Au), indium (In), gallium (Ga), platinum (Pt), silver (Ag), and iron (Fe).

In some embodiments, a template may be employed in direct ion-etching. For example, an aluminum oxide nanotemplate, or a lithographically-defined template, with a defined array of holes may be placed over a material such as silicon, which is disposed on a substrate surface (such as glass or ceramic, for example). The etching process may provide controlled formation of the nanowall structure from which the conformal layers may be deposited (after removal of the template by a wet or dry etch) in a bottom up approach. In alternate embodiments, all the layers of a stacked multi-junction device may be placed sequentially on the substrate prior to etching. Etching may then be performed through each of the stacked layers to provide the final nanowall multi-junction device.

In some such above-described method embodiments, the step of conformally-depositing the multilayered film is carried out using a technique selected from the group consisting of CVD, MOCVD, PECVD, HWCVD, layer-by-layer, sputtering, and combinations thereof.

Solar Panels and Optoelectronic Devices

In some embodiments, the present invention is directed to a solar panel which may include at least one multi-junction nanostructure-based photovoltaic device, as disclosed herein. The solar panel isolates each devices from their surrounding atmospheric environment and permits the generation of electrical power. In some embodiments, the photovoltaic devices may be horizontally mounted and, thus, obviate the need for tracking systems that track the sun. The solar panel may, in certain embodiments, be in an integrated power system (residential or commercial), in consumer electronics, or in solar power stations. It is noted that fabrication of solar panels is well known in the art and hence will not be described in detail herein for the sake of brevity.

While embodiments disclosed herein relate to the application of PV devices in solar cells, one skilled in the art will appreciate that such devices may also be incorporated into optoelectronic devices. For example, p-n or p-i-n junction devices with suitable compositions may be incorporated into photodetectors, light emitting diodes (LEDs), or lasers for biosensing, security, and other applications.

Finally, embodiments of the present invention provide multi-junctioned nanostructured photovoltaic devices that may exhibit high efficiencies and may be resistant to light induced degradation. The PV cell constructed in accordance with embodiments disclosed herein may optimize absorption of light and may minimize recombination at hetero-junction interfaces. Other benefits may include low cost and ease of fabrication, especially in embodiments that include a primarily silicon-based cell. Embodiments, in which the nanowalls are conducting, may provide cells that are easier to current match.

The following example is included to demonstrate particular embodiments of the present invention. It should be appreciated by those of skill in the art that the methods disclosed in the example that follows merely represent exemplary embodiments of the present invention. However, those of skill in the art should, in light of the present disclosure, appreciate that many changes can be made in the specific embodiments described and still obtain a like or similar result without departing from the spirit and scope of the present invention.

EXAMPLES

The following experimental example is included to demonstrate embodiments for the growth of nanowalls as disclosed herein. They are intended to be exemplary of the present invention, and thus not limiting.

Example 1

Figure 9:
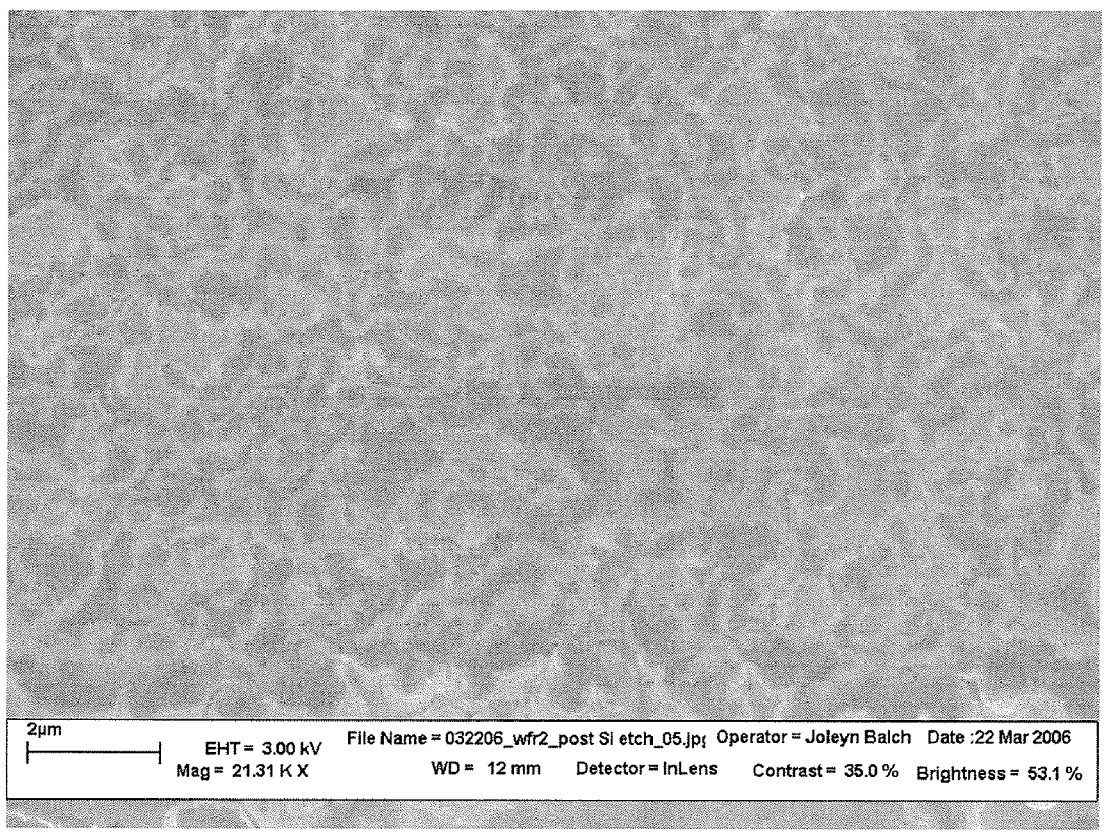
FIG. 9 shows a top view of a silicon nanowall structure, in accordance with one embodiment of the present invention.
Figure 10:
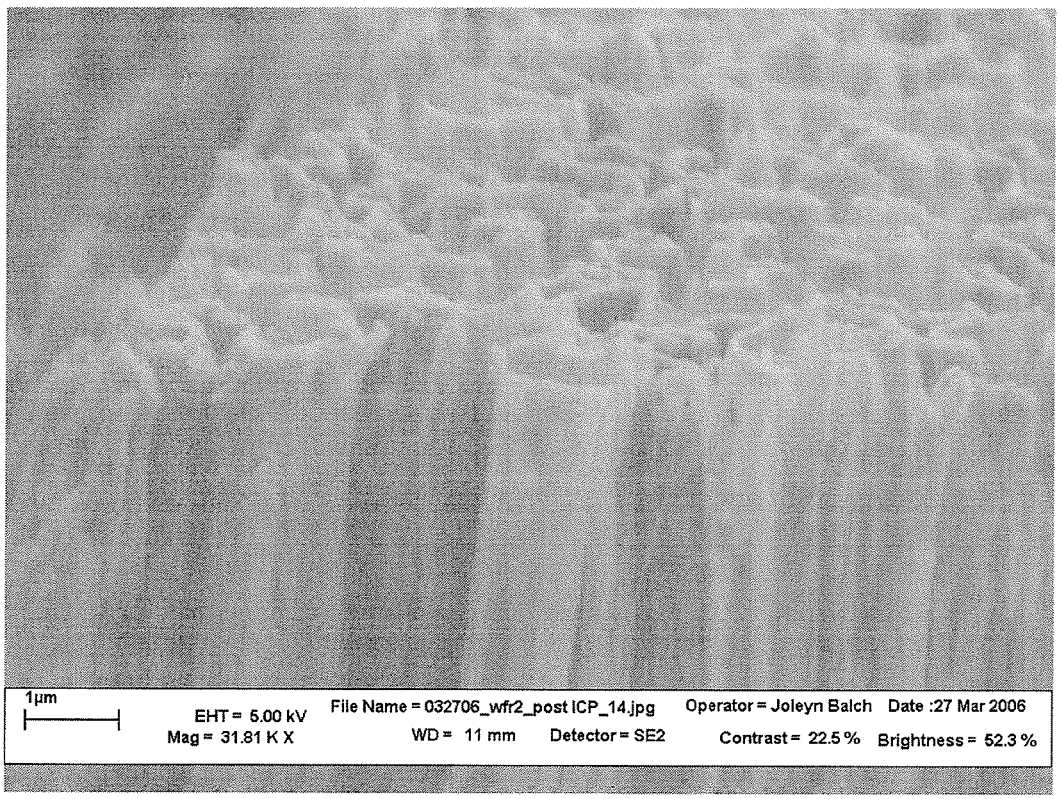
FIG. 10 shows a side view of a silicon nanowall structure, in accordance with one embodiment of the present invention.
Figure 11:
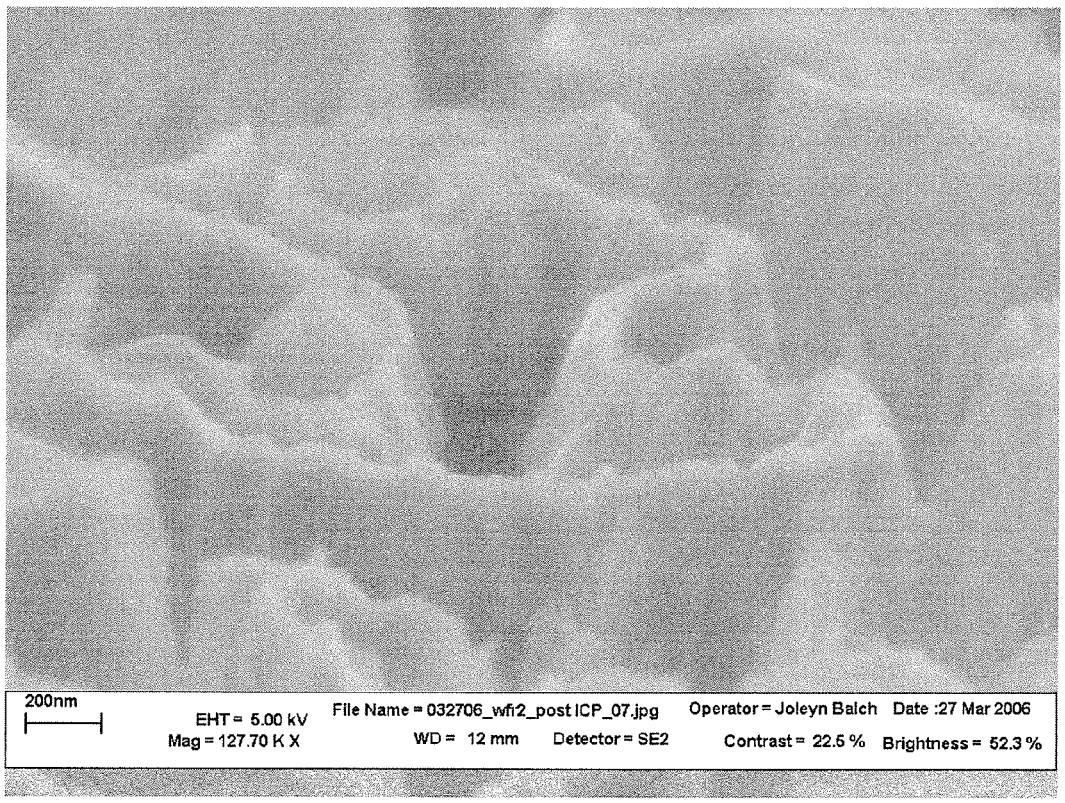
FIG. 11 shows a close up view of FIG. 9.

FIGS. 9-11 show different views of a nanowall structure made according to embodiments in which a combination of dry and wet etching were used. FIG. 9 is a top view of silicon nanowalls. The walls were created by galvanic etching of the silicon surface, deposition of oxide and nickel layers, and an ion-beam etch. The nickel and oxide coating remaining was removed by standard wet etches for Ni (e.g. $HNO_3$(70%): $CH_3COOH$:DI=1:1:1) and silicon oxide (buffered HF). FIG. 10 shows a side view of the silicon nanowalls and FIG. 11 shows a closer view of the canyon-like structures formed by this combination etch method.

Example 2

Figure 12:
FIG. 12 shows ZnO nanowalls on silicon, in accordance with one embodiment of the present invention.

FIG. 12 shows zinc oxide (ZnO) nanowalls on silicon.

It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is:

1. A photovoltaic device, comprising:
a substrate having at least two surfaces;
a plurality of nanowall structures disposed on at least one of the at least two surfaces of the substrate, wherein the nanowall structures comprise elements of photoactive junctions and a network of a random array of closed cell-like connected wall structures comprising a void space within the closed cell and an interconnecting wall between adjacent nanowall structures, the nanowall structures comprising a semiconductor material selected from the group consisting of silicon (Si), silicon germanium (SiGe), germanium (Ge), gallium arsenide (GaAs), indium phosphide (InP), GaInP, indium gallium arsenide (InGaAs), indium nitride (InN), selenium (Se), cadmium telluride (CdTe), Cd—O—Te, Cd—Mn—O—Te, ZnTe, Zn—O—Te, Zn—Mn—O—Te, MnTe, Mn—O—Te, copper oxide, carbon, Cu—In—Ga—Se, Cu—In—Se, and combinations thereof; and
at least one layer conformally deposited over the nanowall structure, wherein the at least one layer is at least a portion of a photoactive junction, wherein portions of the layer that comprise the photoactive junctions comprise an amorphous silicon, amorphous silicon-germanium metal oxide, nanocrystalline silicon, or amorphous silicon carbide; wherein the conformal layer adopts the shape of the nanowall structure.

2. The photovoltaic device of claim 1, wherein the nanowall structures are presented in a bifacial arrangement on the substrate.

3. The photovoltaic device of claim 1, wherein the nanowall structures are conducting.

4. The photovoltaic device of claim 1, wherein the nanowall structures are made of a material that is substantially the same as the substrate.

5. The photovoltaic device of claim 1, wherein the nanowall structures are placed on top of the photoactive junction, wherein the photoactive junction comprises a multilayered film disposed between the nanowall and the substrate.

6. The photovoltaic device of claim 1, wherein the nanowall structures are aligned at an angle between about 0 to 85 degrees relative to the plane of the substrate.

7. The photovoltaic device of claim 1, wherein the nanowall structures comprise random non-interpenetrating nanowalls that have a random angle with respect to the substrate.

8. The photovoltaic device of claim 1, wherein the nanowall structures are semiconductor having a doping of a first type.

9. The photovoltaic device of claim 1, wherein the at least one layer is an amorphous layer of semiconducting material having an interface between the amorphous layer and the nanowall structure, wherein the amorphous layer is compositionally graded from substantially intrinsic at the interface to substantially conducting on an opposing side of the amorphous layer, wherein the graded composition of the amorphous layer is provided by a doping of a second type.

10. The photovoltaic device of claim 1, wherein the at least one layer is selected from a group consisting of a nanocrystalline layer and an amorphous layer.

11. The photovoltaic device of claim 1, wherein the at least one layer is a multilayered film comprising a plurality of photoactive junctions.

12. The photovoltaic device of claim 11, wherein the multilayered film comprises at least one p-n junction.

13. The photovoltaic device of claim 11, wherein the multilayered film comprises at least one p-i-n junction.

14. The photovoltaic device of claim 11, wherein the multilayered film further comprises at least one tunnel junction.

15. The photovoltaic device of claim 1, wherein the at least one layer comprises a relative thickness in the range from 5 Å to 50,000 Å.

16. The photovoltaic device of claim 15, wherein the relative thickness is chosen for current matching.

17. The photovoltaic device of claim 1 further comprising:
a transparent conductive material (TCM) disposed conformally over the at least one layer.

18. The photovoltaic device of claim 17, further comprising:
a top and a bottom contact operable for connecting the photovoltaic device to an external circuit, wherein the top contact is disposed on the TCM and the bottom contact is disposed on a surface of the substrate opposite the nanowall structure or integrated within the substrate.

19. The photovoltaic device of claim 1, further comprising:
a top and a bottom contact operable for connecting the photovoltaic device to an external circuit, wherein the top contact is disposed directly on a top layer of the at least one layer and the bottom contact is disposed on a surface of the substrate opposite the nanowall structure or integrated within the substrate.

20. A solar panel comprising at least one photovoltaic device of claim 1, wherein the solar panel isolates such devices from its surrounding atmospheric environment and permits the generation of electrical power.

21. The solar panel of claim 20, wherein the photovoltaic devices can be mounted in a manner that is independent of a system for tracking the sun.

* * * * *